(12) United States Patent
Su

(10) Patent No.: US 8,759,962 B2
(45) Date of Patent: Jun. 24, 2014

(54) SEMICONDUCTOR CHIP DEVICE WITH SOLDER DIFFUSION PROTECTION

(71) Applicant: Michael Z. Su, Round Rock, TX (US)

(72) Inventor: Michael Z. Su, Round Rock, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/662,428

(22) Filed: Oct. 27, 2012

(65) Prior Publication Data

US 2013/0049229 A1 Feb. 28, 2013

Related U.S. Application Data

(62) Division of application No. 12/643,477, filed on Dec. 21, 2009, now Pat. No. 8,299,633.

(51) Int. Cl.
*H01L 23/02* (2006.01)

(52) U.S. Cl.
USPC ........... 257/686; 257/687; 257/750; 257/767; 257/772; 257/782; 438/25; 438/26; 438/106; 438/108; 438/109

(58) Field of Classification Search
USPC ......... 257/486, 686–687, 750–751, 767, 772, 257/777–778, 782
See application file for complete search history.

(56) References Cited

U.S. PATENT DOCUMENTS

| | | | |
|---|---|---|---|
| 5,737,191 A * | 4/1998 | Horiuchi et al. | ............. 361/764 |
| 5,998,243 A | 12/1999 | Odashima et al. | |
| 6,258,626 B1 | 7/2001 | Wang et al. | |
| 6,339,254 B1 | 1/2002 | Venkateshwaran et al. | |
| 6,468,833 B2 | 10/2002 | Uner et al. | |
| 6,576,540 B2 | 6/2003 | Hsu et al. | |
| 6,583,502 B2 | 6/2003 | Lee et al. | |
| 6,593,662 B1 | 7/2003 | Pu et al. | |
| 6,717,253 B2 | 4/2004 | Yang | |
| 6,812,548 B2 * | 11/2004 | Dias et al. | ..................... 257/620 |
| 6,820,329 B2 | 11/2004 | Fang | |
| 6,853,064 B2 | 2/2005 | Bolken et al. | |
| 6,853,084 B2 | 2/2005 | Hsu et al. | |

(Continued)

FOREIGN PATENT DOCUMENTS

| | | |
|---|---|---|
| EP | 1909546 A1 | 4/2008 |
| JP | 61063042 | 4/1986 |
| WO | WO2006134914 A1 | 12/2006 |
| WO | WO2010107542 | 9/2010 |

OTHER PUBLICATIONS

Tom Krazit; *Intel shows off 80-core processor*; CNET News.com; http://news.com.com/Intel+shows+off+80-core+processor/2100-1006 3; Feb. 11, 2007.

(Continued)

*Primary Examiner* — Steven Loke
*Assistant Examiner* — Cuong B Nguyen
(74) *Attorney, Agent, or Firm* — Timothy M. Honeycutt

(57) ABSTRACT

Various methods and apparatus for establishing thermal pathways for a semiconductor device are disclosed. In one aspect, a method of manufacturing is provided that includes providing a first semiconductor chip that has a substrate and a first active circuitry portion extending a first distance into the substrate. A barrier is formed in the first semiconductor chip that surrounds but is laterally separated from the first active circuitry portion and extends into the substrate a second distance greater than the first distance.

14 Claims, 8 Drawing Sheets

(56) References Cited

U.S. PATENT DOCUMENTS

| | | |
|---|---|---|
| 6,916,685 B2 | 7/2005 | Yang et al. |
| 7,041,591 B1 | 5/2006 | Lee et al. |
| 7,057,277 B2 | 6/2006 | Chen et al. |
| 7,081,402 B2 | 7/2006 | Hsu et al. |
| 7,109,576 B2 | 9/2006 | Bolken et al. |
| 7,198,980 B2 | 4/2007 | Jiang et al. |
| 7,396,753 B2 | 7/2008 | Chu et al. |
| 7,399,399 B2 | 7/2008 | Chou et al. |
| 7,485,970 B2 | 2/2009 | Hsu et al. |
| 7,528,474 B2 | 5/2009 | Lee |
| 7,545,048 B2 | 6/2009 | Meyer et al. |
| 2002/0006686 A1 | 1/2002 | Cloud et al. |
| 2003/0102526 A1* | 6/2003 | Dias et al. .................... 257/618 |
| 2004/0251530 A1 | 12/2004 | Yamaji |
| 2006/0006493 A1 | 1/2006 | Kawano et al. |
| 2007/0059915 A1* | 3/2007 | Akram .......................... 438/597 |
| 2008/0088002 A1* | 4/2008 | Tseng ........................... 257/686 |
| 2008/0093733 A1 | 4/2008 | Hsu |
| 2009/0057881 A1 | 3/2009 | Arana et al. |

OTHER PUBLICATIONS

PCT/US2010/059981 Partial International Search Report mailed Apr. 19, 2011.

PCT/US2010/059981 International Search Report mailed Jun. 29, 2011.

PCT/US2010/059981 International Preliminary Report on Patentability mailed Jul. 5, 2012.

* cited by examiner

SEMICONDUCTOR CHIP DEVICE WITH SOLDER DIFFUSION PROTECTION

This application is a divisional of Ser. No. 12/643,477, filed Dec. 21, 2009.

BACKGROUND OF THE INVENTION

1. Field of the Invention

This invention relates generally to semiconductor processing, and more particularly to thermal interface material structures for semiconductor chip packaging and to methods of making the same.

2. Description of the Related Art

Many current integrated circuits are formed as multiple dice on a common wafer. After the basic process steps to form the circuits on the dice are complete, the individual die are singulated from the wafer. The singulated die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder joints are provided between the bond pads of the die and the substrate interconnects to establish ohmic contact. After the die is mounted to the substrate, a lid is attached to the substrate to cover the die. Some conventional integrated circuits, such as microprocessors, generate sizeable quantities of heat that must be transferred away to avoid device shutdown or damage. The lid serves as both a protective cover and a heat transfer pathway.

To provide a heat transfer pathway from the integrated circuit to the lid, a thermal interface material is placed on the upper surface of the integrated circuit. In an ideal situation, the thermal interface material fully contacts both the upper surface of the integrated circuit and the portion of the lower surface of the lid that overlies the integrated circuit. Conventional thermal interface materials include various types of pastes, and in some cases, a metal. Gel-type thermal interface materials consist of a polymeric matrix interspersed with thermally conductive particles, such as aluminum. More recently, designers have begun to turn to solder materials as a thermal interface material, particularly for high power-high temperature chips.

A solder thermal interface material like indium has favorable thermal properties that work well for high power-high temperature die. However, indium exhibits relatively poor adhesion to silicon. To facilitate bonding with indium, the backside of a silicon die may be provided with a metallization stack that includes a layer that readily adheres to silicon, a layer that readily wets indium and perhaps one or more intermediary barrier or other layers. An entire wafer of dice may be provided with respective metallization stacks en masse prior to dicing. To establish favorable thermal contact between a conventional solder thermal interface material and the semiconductor chip and lid that bracket it, a reflow process is performed to wet the applicable surfaces.

Stacked dice present an additional technical challenge for integration of solder thermal interface materials. A stacked dice arrangement is non-planar relative to the underlying package substrate, yet thermal contact between the solder thermal interface material, each chip and the lid is often desired. This can expose the exterior sidewalls of the uppermost of the stacked dice to potential diffusion of solder into critical circuit structures.

The present invention is directed to overcoming or reducing the effects of one or more of the foregoing disadvantages.

SUMMARY OF EMBODIMENTS OF THE INVENTION

In accordance with one aspect of the present invention, a method of manufacturing is provided that includes providing a first semiconductor chip that has a substrate and a first active circuitry portion extending a first distance into the substrate. A barrier is formed in the first semiconductor chip that surrounds but is laterally separated from the first active circuitry portion and extends into the substrate a second distance greater than the first distance.

In accordance with another aspect of the present invention, a method of manufacturing is provided that includes coupling a first semiconductor chip that has a first peripheral wall to a second a second semiconductor chip that has a second peripheral wall with a gap between the first and second semiconductor chips. A barrier layer is formed that covers at least the first peripheral wall of the first semiconductor chip. A solder-type thermal interface material is positioned around the first peripheral wall. The barrier layer inhibits diffusion of the solder-type thermal interface material into the first peripheral wall.

In accordance with another aspect of the present invention, a method of manufacturing is provided that includes coupling a first semiconductor chip that has first and second principal sides and a first peripheral wall to a second a second semiconductor chip that has first and second principal sides with a gap between the first and second semiconductor chips. A first solder-type thermal interface material portion is positioned on the second principal side of the first semiconductor chip. A second solder-type thermal interface material portion is positioned on the first principal side of the second semiconductor chip but laterally separated from the first solder-type thermal interface to leave a space.

In accordance with another aspect of the present invention, an apparatus is provided that includes a first semiconductor chip that has a substrate and a first active circuitry portion extending a first distance into the substrate. A barrier is in the first semiconductor chip that surrounds but is laterally separated from the first active circuitry portion and extends into the substrate a second distance greater than the first distance.

In accordance with another aspect of the present invention, an apparatus is provided that includes a first semiconductor chip that has first and second principal sides and a first peripheral wall. A second semiconductor chip includes a first principal side coupled to the first principal side of the first semiconductor chip with a gap between the first and second semiconductor chips, a second principal side and a second peripheral wall. A barrier layer covers at least the first peripheral wall of the first semiconductor chip and a solder-type thermal interface material surrounds the first peripheral wall. The barrier layer inhibits diffusion of the solder-type thermal interface material into the first peripheral wall.

In accordance with another aspect of the present invention, an apparatus is provided that includes a first semiconductor chip that has first and second principal sides and a first peripheral wall. A second semiconductor chip includes a first principal side coupled to the first principal side of the first semiconductor chip with a gap between the first and second semiconductor chips, a second principal side and a second peripheral wall. A first solder-type thermal interface material portion is positioned on the second principal side of the first semiconductor chip and a second solder-type thermal interface material portion is positioned on the first principal side of the second semiconductor chip but laterally separated from the first solder-type thermal interface material portion to leave a space.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a semiconductor chip device are described herein. One example includes two stacked semiconductor chips mounted to a circuit board. A heat spreader or lid covers the chips. A solder-type thermal interface material provided a thermal pathway between the lid and the semiconductor chips. The upper semiconductor chip is provided with a barrier that inhibits diffusion of the solder-type thermal interface material into sensitive circuit structures. Additional details will now be described.

Figure 1:
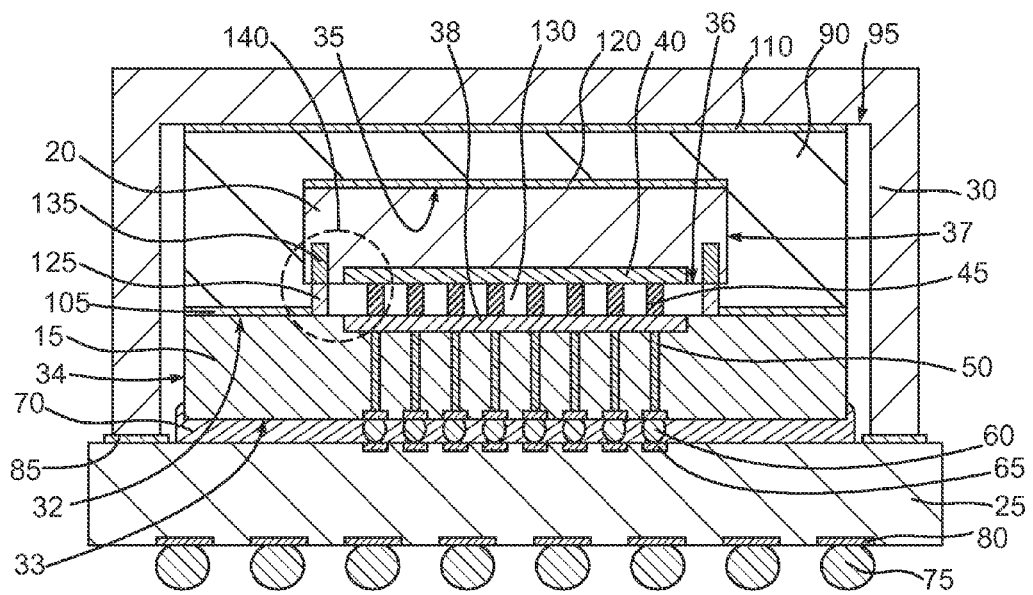
FIG. 1 is a sectional view of an exemplary embodiment of a semiconductor chip device that includes stacked semiconductor chips.

In the drawings described below, reference numerals are generally repeated where identical elements appear in more than one figure. Turning now to the drawings, and in particular to FIG. 1, therein is shown a sectional view of an exemplary embodiment of a semiconductor chip device 10 that includes stacked semiconductor chips 15 and 20 mounted on a circuit board 25 and enclosed by a heat spreader or lid 30. While two semiconductor chips 15 and 20 are depicted, it should be understood that the techniques disclosed herein may be applied to greater numbers both stacked or otherwise. The semiconductor chip 15 includes principal sides 32 and 33 and a peripheral wall 34. The semiconductor chip 20 similarly includes principal sides 35 and 36 and a peripheral wall 37. The semiconductor chips 15 and 20 include respective active circuitry regions 35 and 40 that are relatively small in thickness compared to the overall thicknesses of the chips 15 and 20, respectively. The active circuitry regions 38 and 40 include the various logic and other types of circuits that provide the functionality for the individual chips 15 and 20 as well as plural interconnect layers such as metallization or other types of interconnect layers and interlevel dielectric layers. The semiconductor chip 15 may be electrically connected to the semiconductor chip by way of plural conductive posts 45. Optionally, other types of die-to-die interconnects may be used such as solder joints, conductive pillar plus solder, or other types of interconnects. To provide the input/output of power, ground and signals for both the semiconductor chips 15 and 20, the semiconductor chip 15 may be provided with plural thru-vias 50 which terminate at conductor pads 55. The semiconductor chip 15 may be mounted to the circuit board 25 by way of plural solder joints 60 which are metallurgically bonded to a corresponding plurality of conductor pads 65. An underfill material layer 70 may be interposed between the semiconductor chip 15 and the circuit board 25 to lessen the effects of differential CTE.

The semiconductor chips 15 and 20 may be any of a myriad of different types of circuit devices used in electronics, such as, for example, microprocessors, graphics processors, combined microprocessor/graphics processors, application specific integrated circuits, memory devices or the like, and may be single or multi-core or even stacked with additional dice. The semiconductor chips 15 and 20 may be constructed of bulk semiconductor, such as silicon or germanium, or semiconductor on insulator materials, such as silicon-on-insulator materials.

The circuit board 25 may be a semiconductor chip package substrate, a circuit card, or virtually any other type of printed circuit board. Although a monolithic structure could be used for the circuit board 25, a more typical configuration will utilize a build-up design. In this regard, the circuit board 25 may consist of a central core upon which one or more build-up layers are formed and below which an additional one or more build-up layers are formed. The core itself may consist of a stack of one or more layers. If implemented as a semiconductor chip package substrate, the number of layers in the circuit board 25 can vary from four to sixteen or more, although less than four may be used. So-called "coreless" designs may be used as well. The layers of the circuit board 25 may consist of an insulating material, such as various well-known epoxies, interspersed with metal interconnects. A multi-layer configuration other than buildup could be used. Optionally, the circuit board 25 may be composed of well-known ceramics or other materials suitable for package substrates or other printed circuit boards. The circuit board 115 is provided with a number of conductor traces and vias and other structures (not visible) in order to provide power, ground and signals transfers between the semiconductor chip 110 and another device, such as another circuit board for example. The circuit board 25 may be electrically connected to another device (not shown) by way of an input/output array such as the ball grid array depicted. The ball grid array includes plural solder balls 75 metallurgically bonded to respective ball pads 80. The ball pads 80 are interconnected to the conductor pads 65 by way of plural interconnect traces and vias and other structures that are not shown. Optionally, other types of interconnects may be used for the circuit board 25, such as pin grid arrays, land grid arrays or other types of interconnect structures.

The lid 30 may be a bath tub design as depicted, a top hat design or some other configuration as desired. The lid 30 may be composed of well-known ceramics or metallic materials as desired. Some exemplary materials include nickel plated copper, anodized aluminum, aluminum-silicon-carbon, aluminum nitride, boron nitride or the like. The lid 25 may be secured to the substrate 20 by an adhesive 85 composed of a well-known thixotropic adhesive, an epoxy, another type of polymer or even a solder.

A solder-type thermal interface material 90 is positioned between the semiconductor chip 20 and the under surface 95 of the lid 30. To facilitate the wetting of the thermal interface material 90 to the various surfaces of the lid 30 and the semiconductor chips 15 and 20, various adhesion layers may be formed. For example, the principal side 32 of the semiconductor chip 15 may be provided with an adhesion layer 105. The adhesion layer 105 may be monolithic or a laminate. Similarly, the under surface 95 of the lid 30 may be provided with an adhesion layer 110 and the principal side 35 of the semiconductor chip 20 may be provided with an adhesion layer 120, both of which may be monolithic or laminates. Additional details of the adhesion layers 105, 110 and 115 will be provided below. The solder-type thermal interface material 90 may be composed of a variety of solder materials suitable for thermal interface materials such as, for example, indium, indium solder, tin-silver, bismuth-tin, other tin solders, gallium plus a polymer or the like.

Still referring to FIG. 1, a dike 125 is positioned between the semiconductor chips 15 and 20, surrounds the interconnect structures 45 and acts to prevent the infusion of the thermal interface material 90 into the space 130 between the chips 15 and 20 where electrical shorts might otherwise occur. The dike 125 may be composed of a variety of materials, such as, copper, silver, platinum, gold, aluminum, palladium, alloys of these or the like. In addition, a barrier 135 is formed in and extends around the perimeter of the semiconductor chip 20 and acts as a barrier against the unwanted diffusion of the solder type thermal interface material 90 into the semiconductor chip 20 particularly near the active device region 40. As described in more detail below, the barrier 135 may be composed of a variety of materials, such as, for example, densified silicon nitride, silicon oxynitride, silicon with a quantity of implanted ions that inhibit metal diffusion, or the like.

Figure 2:
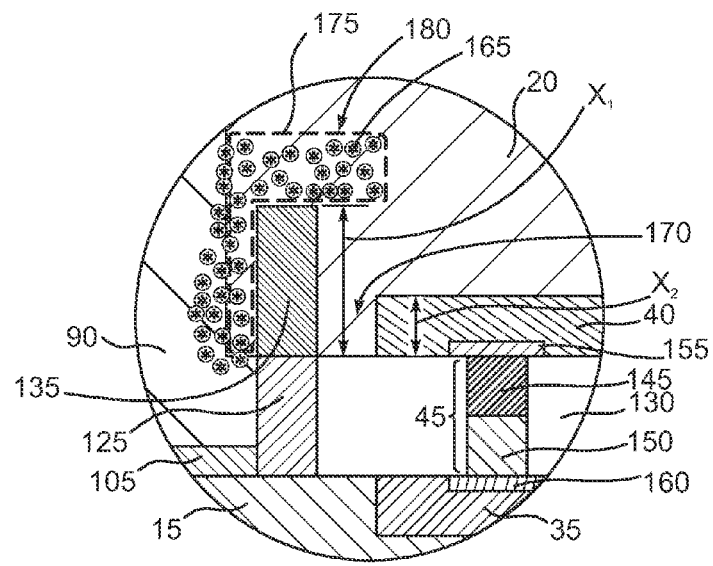
FIG. 2 is a portion of FIG. 1 shown at greater magnification.

The portion of FIG. 1 circumscribed by the dashed oval 140 will be shown at great magnification in FIG. 2 and used to describe additional details of the dike 125 and the barrier 135. Attention is now turned to FIG. 2. Because FIG. 2 is at a higher magnification than FIG. 1, several features are visible in FIG. 2 that were not in FIG. 1. For example, the interconnect structure 45 may consist of respective posts 145 and 150 joined together by thermal bonding, solder or some other technique. The post 145 is connected to a conductor pad 155 of the semiconductor chip 20 and the post 150 is connected to a conductor pad 160 of the semiconductor chip 15. Small portions of the active device regions 38 and 40 of the semiconductor chips 15 and 20 are visible. As noted above, it is desirable to prevent the diffusion of portions or particles 165 of the solder-type thermal interface material 90 into the portion 170 of the semiconductor chip 20 proximate the active device region 40 thereof. The barrier 135 is designed to impede such diffusion of the particles 165. It is not necessary for the barrier to impede all diffusion. Accordingly, the barrier 135 is advantageously provided with a height, $x_1$, that is larger than the thickness, $x_2$, of the active device region 40. This is easily accomplished since the thickness of the active device region 40 is normally a small fraction of the overall thickness of the semiconductor chip 20. A hypothetical diffusion of the thermal interface material particles 165 is illustrated by the dashed L-shaped region 175. The fact that there is some diffusion of the indium particles 165 proximate the portion 180 of the semiconductor chip 20 is not problematic since the region 170 nearer to the active device region 40 is protected from the diffusion. Note that the semiconductor chip 20 is positioned on the semiconductor chip 15 so that the barrier 135 and the dike 125 are in substantial vertical alignment. This vertical alignment is not strictly necessary. The space 130 between the semiconductor chips 15 and 20 may be an air gap or filled with some type of underfill material layer as desired.

A small portion of the adhesion layer 105 is visible. The adhesion layer 105 may be composed of a variety of materials that are suitable to wet the material selected for the thermal interface material 90 and to the upper surface 100 of the semiconductor chip 15. In an exemplary embodiment, the adhesion layer 105 may consist of laminate of copper and gold. Indeed and referring again to FIG. 1 momentarily, the adhesion layer 120 of the semiconductor chip 20 may consist of the same types of materials. In an exemplary embodiment, the adhesion layer 120 may consist of an aluminum film formed on the semiconductor chip 20, a titanium film formed on the aluminum film, a nickel-vanadium film formed on the titanium film and a gold film formed on the nickel-vanadium film. The aluminum film provides advantageous adhesion with silicon. The titanium film provides a barrier layer to prevent gold and indium from migrating into the semiconductor chip 20 and to facilitate adhesion with the nickel-vanadium film, and the nickel-vanadium film provides desirable adhesion with gold and a barrier to inhibit diffusion into the titanium layer. The gold film provides a desirable wetting surface for indium. The adhesion layer 110 may be composed of the same types of materials or for example gold or a gold alloy alone.

Figure 3:
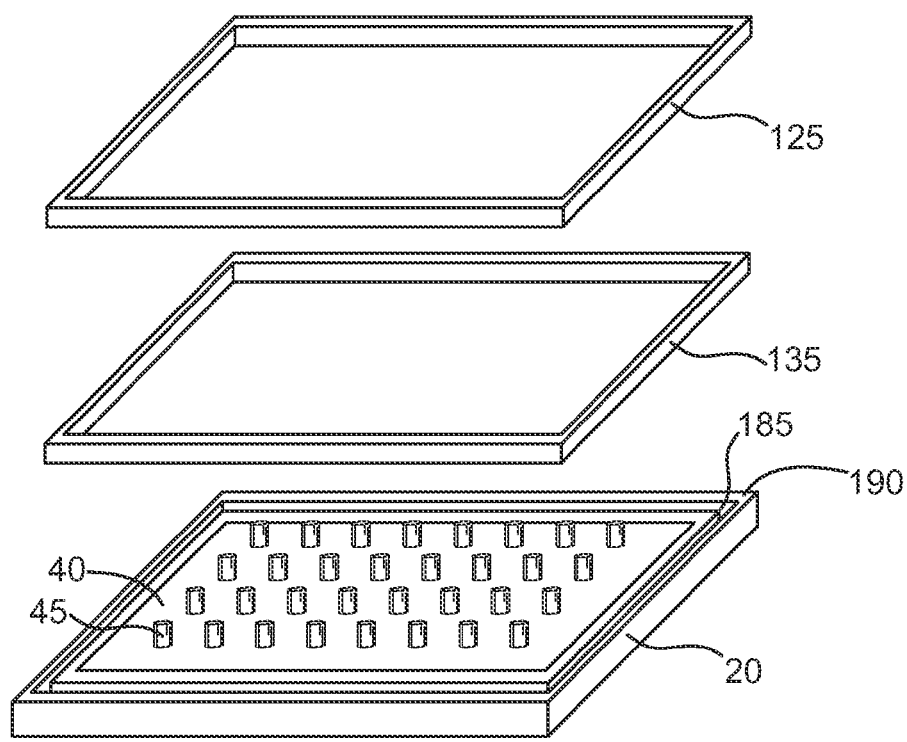
FIG. 3 is a partially exploded pictorial view of one of the semiconductor chips flipped over from the orientation depicted in FIG. 1.
Figure 4:
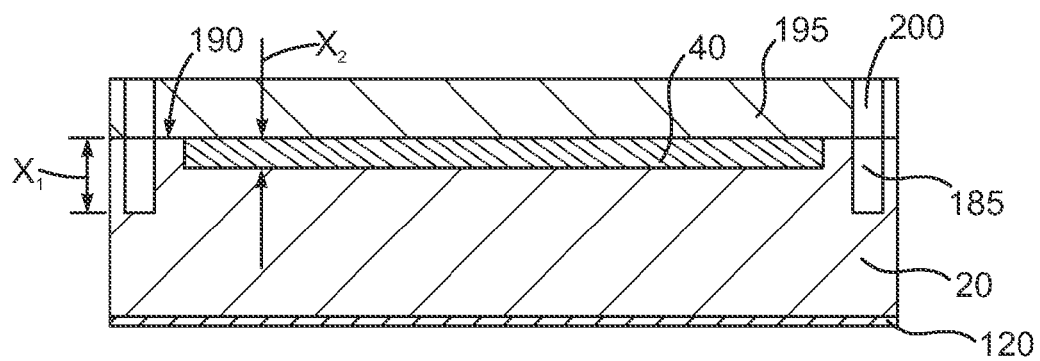
FIG. 4 is a sectional view of one of the semiconductor chips undergoing exemplary barrier trench formation.

Additional details of the dike 125, the barrier 135 and the semiconductor chip 20 may be understood by referring now to FIG. 3, which is a partially exploded pictorial view that shows the dike 125 and the barrier 135 exploded from the semiconductor chip 20. Note that the semiconductor chip 20 is shown flipped over from the orientation depicted in FIG. 1. Thus, the interconnect structures 45 and a portion of the active device region 40 are visible. In this illustrative embodiment, the barrier 135 may be composed of a frame-like structure composed of, for example, densified silicon nitride. The barrier 135 is formed in a frame-like trench 185 formed in the side 190 of the semiconductor chip 20 outside of the active device region 40. The dike 125 may have a footprint that generally tracks the footprint of the barrier 135 and both the dike and the barrier 125 and 135 will generally have a footprint that tracks the footprint of the semiconductor chip 20 such as square, rectangular, etc. Additional details regarding the formation of the trench 185 will be described in conjunction with subsequent figures. Referring now to FIG. 4, which is a sectional view of the semiconductor chip 20 flipped over from the orientation depicted in FIG. 1, the trench 185 may be formed in the semiconductor chip 20 by a variety of techniques for material removal. In an exemplary embodiment, an etch mask 195 may be applied to the surface 190 of the semiconductor chip 20 and patterned to have an opening 200 positioned and shaped to have the footprint of the desired footprint for the trench 185. The mask 195 protects the underlying active device region 40. At this stage, the semiconductor chip 20 may have already been provided with the adhesion layer 120. It should be understood that the process steps to establish the barrier 135 may be performed on the semiconductor chip at the wafer level or at the die level stage as desired. Following the lithographic patterning of the opening 200 in the mask 195, a deep trench etch may be performed to establish the trench 185 in the semiconductor chip 20. The trench 185 is advantageously etched to a depth of $x_1$ which as noted above, is advantageously greater than the depth $x_2$ of the active device region 40. The deep trench etch may be performed by plasma etching with parameters selected to provide a relatively anisotropic etch profile. Exemplary etch chemistries include $CF_4$, $SF_6$, $NF_3$, $H_2/Cl_2/SiCl_4$ or the like. Optionally, laser ablation may be used to form the trench 185 with or without a protective mask.

Figure 5:
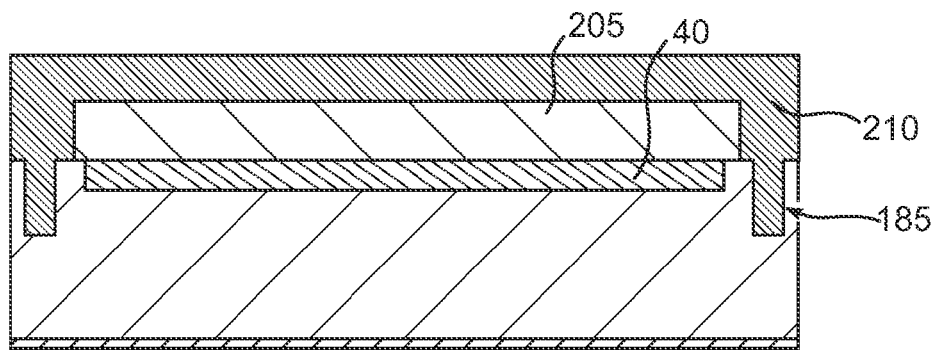
FIG. 5 is a sectional view like FIG. 4 depicting deposition of barrier material in the trench.
Figure 6:
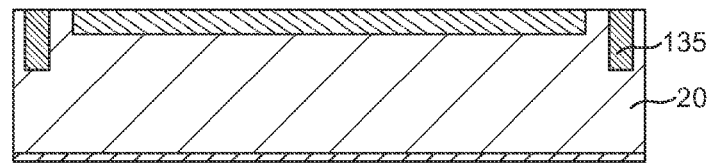
FIG. 6 is a sectional view like FIG. 5 depicting planarization of the exemplary barrier material.

Referring now to FIG. 5, the mask 195 depicted in FIG. 5 is stripped, another lithography mask 205 is formed over the active device region 40 and a deposition process is performed to establish densified silicon nitride 210 in the trench 185. The densified silicon nitride 210 may be deposited by chemical vapor deposition with or without plasma enhancement, or other deposition techniques. Of course some of the silicon nitride 210 will overcoat the mask 205. Following the deposition, an etch process may be performed to remove the excessive portions of the densified silicon nitride 210 and the mask 205 may be stripped as shown in FIG. 6 to leave the completed barrier 135. The excess silicon nitride 210 may be removed by a dry etch using chemistries such as $CF_4$, $SF_6$ or $NF_3$. A wet etch could be used with for example a hot phosphoric acid dip. Such a wet etch would also remove the mask 210. The mask 205 may be removed by ashing, solvent stripping or other mask removal techniques. At this stage, the semiconductor chip 20 and in particular the active device region 40 thereof, may be provided with the conductive pillars 145 and flip chip mounted to the semiconductor chip 15 depicted in FIGS. 1 and 2.

Figure 7:
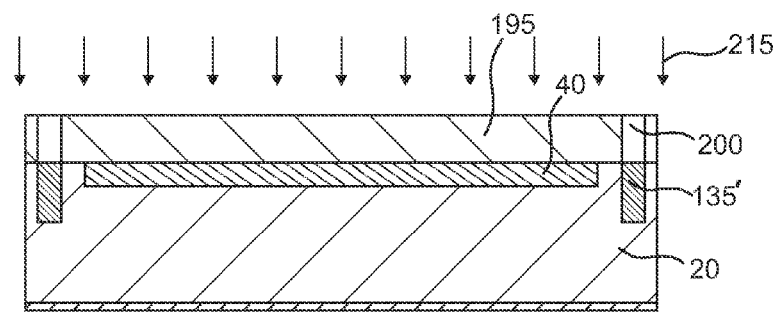
FIG. 7 is a sectional view like FIG. 5, but depicting an alternate exemplary formation of a barrier trench.
Figure 8:
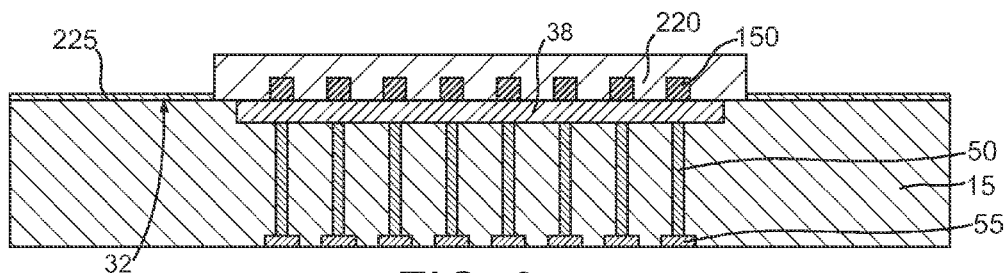
FIG. 8 is a sectional view of the other semiconductor chip depicted in FIG. 1 undergoing exemplary seed layer formation.

As noted elsewhere herein, the barrier 135 may be formed by other than the deposition of a particular material such as densified silicon nitride. For example, and as depicted in FIG. 8, the barrier may be formed by ion implantation. FIG. 7 depicts a sectional view like FIG. 4 of the semiconductor chip 15 fitted with a lithography mask 195 that has the patterned opening 200 as described above. Here in lieu of an etch and subsequent material deposition process, ions 215 may be implanted to establish the barrier 135'. The type of ion species 215 selected for the implant is subject to a great variety. In an exemplary embodiment, the ions 215 may be, for example, tantalum or titanium. Such species can, through kinetic energy transfer, disrupt the lattice structure of the implanted portions of the semiconductor chip. The disrupted regions become more resistant to diffusion of the solder type thermal interface material 90 into the portion of the chip 20 proximate the active device region 40. Species such as tantalum and titanium are cost effective and well understood in semiconductor fabrication. A suitable energy range may be about 300 keV to 1.0 MeV. Following the implant, the mask 195 may be removed by ashing, solvent stripping or the like.

Attention is now turned to a description of an exemplary fabrication process for the dike 125 depicted in FIGS. 1 and 2. In this regard, attention is now turned to FIG. 8, which is a sectional view of the semiconductor chip 15 shown in the same orientation as in FIGS. 1 and 2. The semiconductor chip 15 is depicted at a stage of processing prior to the application of the semiconductor chip 20 thereto and the application of the solder joints 60 that are used to link the chip 15 to the circuit board 25 depicted in FIG. 1. At this stage, the active device region 38 of the semiconductor chip 15 has already been provided with the conductor studs 150, as well as the through silicon vias 50 and the conductor pads 55. A photolithography mask 220 is formed over the interconnect studs 150 and the entirety of the active device region 38. Next, a very thin copper seed layer 225 is applied to the principal side 32 of the semiconductor chip 15. Materials other than copper may be used. The seed layer 225 may be applied by plating, sputtering or the like. The purpose of the seed layer 225 is to facilitate the subsequent plating of the dike 125 depicted in FIGS. 1 and 2.

Figure 9:
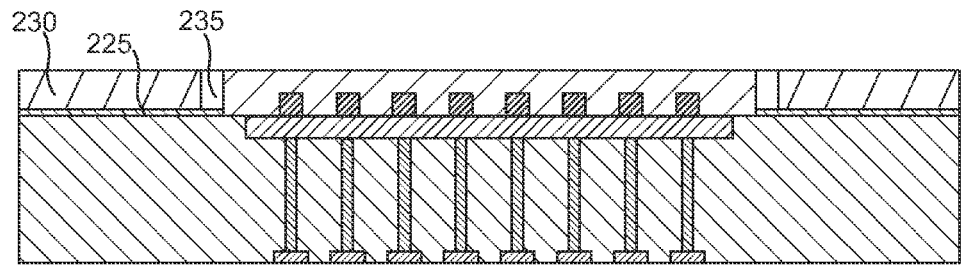
FIG. 9 is a sectional view like FIG. 8 depicting mask formation.

Next and as depicted in FIG. 9, a second photolithography mask 230 is formed on the seed layer 225 but is not coextensive therewith so as to leave a trench 235 which has the desired footprint of the subsequently formed dike. The trench 235 may be patterned in the mask 230 by well-known lithography processes. The mask 220 is left in place during the lithographic processing of the mask 230.

Figure 10:
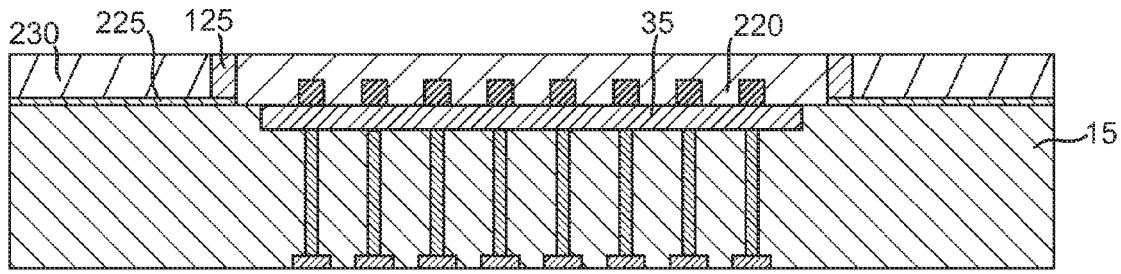
FIG. 10 is a sectional view like FIG. 9, but depicting formation of an exemplary dike on the semiconductor chip.

Next, and as depicted in FIG. 10, a plating process may be used to establish the dike 125 in the trench 235 between the photolithography mask 230 and the photolithography mask 220. The seed layer 225 is used to establish the requisite electrical pathway in order to facilitate the plating of the dike 125. In an exemplary embodiment, the dike 125 may be composed of copper. However, other conductor materials may be used such as alloys of copper, gold, platinum, palladium, aluminum or the like. Indeed, techniques other than plating may be used to establish the dike 125, such as physical vapor deposition or other techniques. Because the dike 125 constitutes a structure that may be laterally separated from the active device region 35 and sit above the surface 100 of the chip 15, the dike 125 could also be fabricated as a separate component that is thereafter seated on the semiconductor chip 15 and secured thereto by for example an adhesive, a solder or some other material joining technique. Following the formation of the dike 125, the lithography masks 220 and 235 may be stripped by ashing, solvent stripping or the like.

Figure 11:
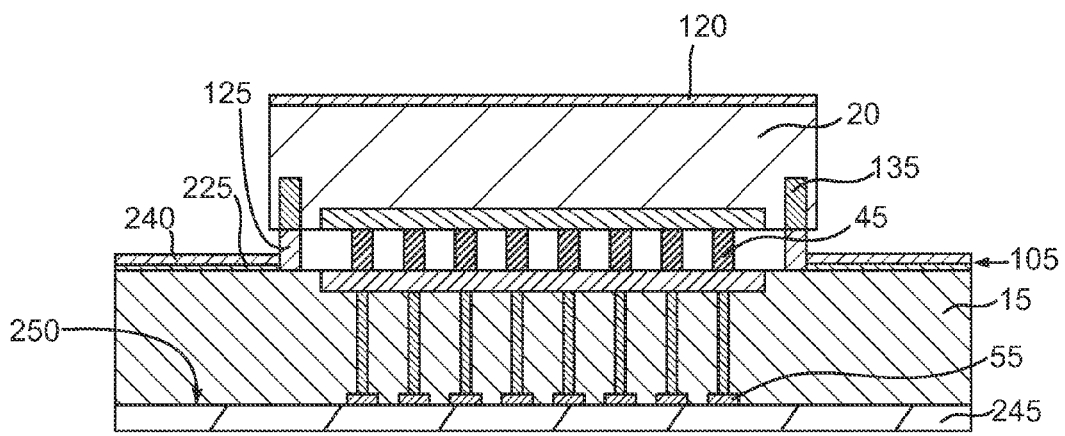
FIG. 11 is a sectional view of the semiconductor chips stacked.

Referring now to FIG. 11, the semiconductor chip 20 may be mounted to the semiconductor chip 15 and the respective conductor studs 145 and 150 joined to establish the plural interconnect structures 45. If indium is selected as the solder thermal interface material to be subsequently used, then the adhesion layer 105 may be completed depositing a film that wets indium such as gold. Here, the gold film 240 may be applied to the previously formed copper seed layer 225 by, for example, a flash plating process or other process suitable to deposit a gold film. A protective lithography mask 245 may be applied to the opposite side 250 of the semiconductor chip 15 to avoid the deposition of gold on the conductor pads 55. The dike 125 will constrain the plating of the gold film 240. If desired, the plating process to establish the gold film 240 may be used to establish the uppermost portion of the adhesion layer 120 on the semiconductor chip 20 if desired. As noted elsewhere herein, the barrier 135 in the semiconductor chip 20 may be aligned vertically with the dike 125. Following the deposition of the gold film 240, the mask 245 may be stripped using ashing, solvent stripping or the like.

Figure 12:
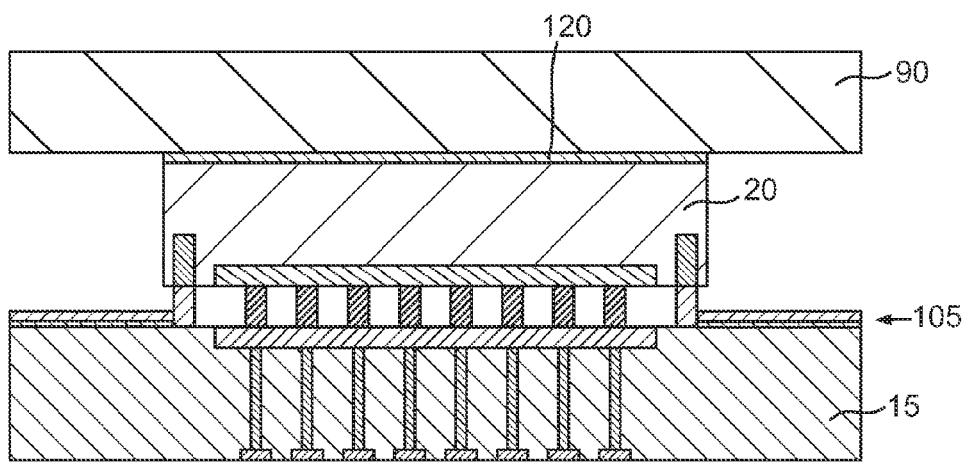
FIG. 12 is a sectional view like FIG. 11 depicting positioning of a solder-type thermal interface material on the stack of semiconductor chips.

Attention is now turned to FIG. 12. The thermal interface material 90 may be applied to the combination of the semiconductor chips 15 and 20 in a variety of ways. For example, the thermal interface material 90 may be seated as a preform on the adhesion layer 120 of the semiconductor chip 20. Thereafter, the lid 30 depicted in FIG. 1 may be seated on the thermal interface material 90 and a reflow process established to enable portions of the thermal interface material 90 to liquify and thereafter wet to the adhesion layer 105 as well. If desired, the preform of the solder thermal interface material 90 may be provided with a bathtub shape in advance of the placement thereof on the semiconductor chip 20 to facilitate a more uniform wetting to the adhesion layer 105. In another option, the preform 90 of the solder thermal interface material may be fitted to the lid 30 first and thereafter the lid 30 may be seated on the circuit board 25. In this option, and as shown in FIG. 1, the thermal interface material 90 and the lid 30 would be seated on the circuit board 25 after the semiconductor chips 15 and 20 are mounted to the circuit board 25 and any solder reflow performed as necessary to establish the solder joints 60.

Figure 13:
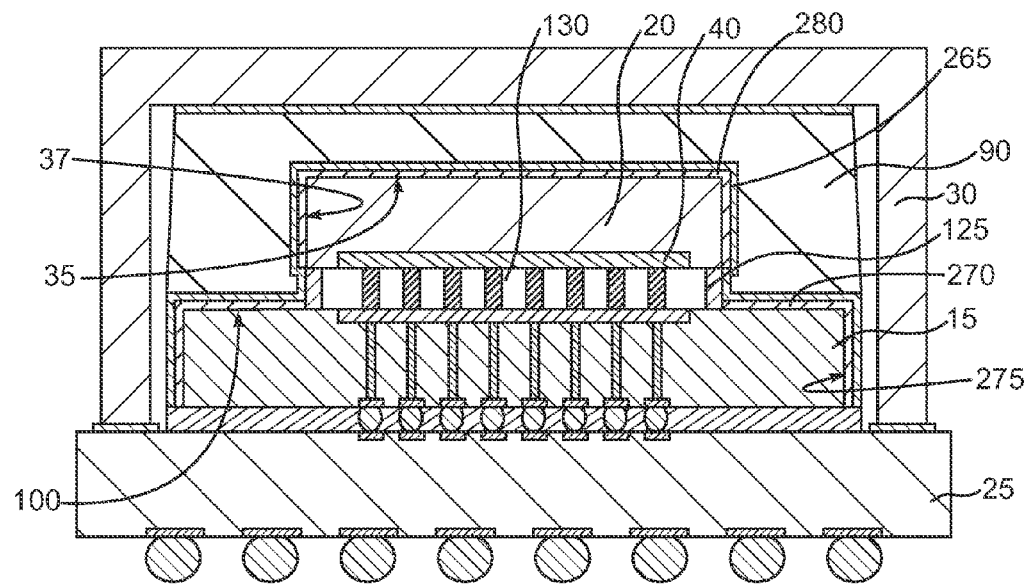
FIG. 13 is a sectional view of an alternate exemplary embodiment of a semiconductor chip device that includes stacked semiconductor chips.

An alternate exemplary embodiment of a semiconductor chip device 260 may be understood by referring now to FIG. 13, which is a sectional view. The semiconductor chip device 260 may share several attributes with the exemplary embodiment of the semiconductor chip device 10 depicted in FIGS. 1 and 2. In this regard, the semiconductor chips 15 and 20 may be stacked and mounted to the circuit board 25 as described elsewhere herein. A lid 30 may be secured to the circuit board 25 and a solder thermal interface material 90 may be used to facilitate heat transfer. However, in lieu of utilizing the barrier 135 depicted in FIGS. 1 and 2 to inhibit the diffusion of the thermal interface material 90 into the portions of the chip 20 proximate the active device region 40 thereof, a blanket coating of a barrier material 265 may be applied over the semiconductor chip 15 and the semiconductor chip 20. The layer 265 is advantageously composed of a material or materials that wet the solder-type thermal interface material 90. In an exemplary embodiment, the layer 265 may be composed of gold. If necessary in order to facilitate the adhesion of the layer 265, a seed layer 270 may be applied to the upper surface 100 and the sides 275 of the chip 15 and a similar seed layer 280 may be applied to the principal side 35 and the peripheral wall 37 of the semiconductor chip 20. If desired, the seed layer 280 may consist of the various layers of the backside metallization stack that would ordinarily be applied to the principal side 35 of the chip 20. The dike 125 may be formed on the semiconductor chip 15 as described elsewhere herein and used to prevent the barrier layer 265 from invading the space 130 between the chips 20 and 15.

Figure 14:
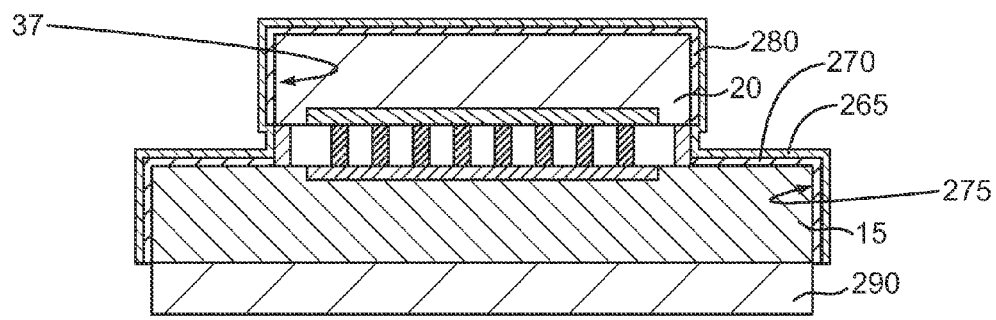
FIG. 14 is a sectional view of the semiconductor chips of FIG. 13 undergoing barrier layer application.

The formation of the barrier layer 265 will be described in conjunction with FIG. 14. As noted above, in order to facilitate the wetting of the barrier layer 265 to the semiconductor chips 15 and 20, the semiconductor chip 15 may be provided with a seed layer 270 that may be fabricated using the same essential process as described above in conjunction with the fabrication of the seed layer 225 depicted in FIG. 8. However, the seed layer 270 will be fabricated so as to extend down the sides 275. In addition, the seed layer 280 may be formed in conjunction with a backside metallization laminate on the chip 20 or as a discrete process as desired. The material point is that the seed layer 280 extends down the peripheral wall 37 of the chip 20. With the seed layers 270 and 280 in place, the chip 20 may be mounted to the chip 15 using the techniques described above in conjunction with the embodiment depicted in FIGS. 1 and 2. Next, a suitable protective mask 290 may be applied to the surface 250 of the chip 15 and the adhesion layer 265 blanket applied over the unmasked portions of the chips 15 and 20. The adhesion layer 265 may be composed of materials that are suitable to wet the thermal interface material to be applied later. In the exemplary embodiment, the barrier layer 265 may be composed of gold and applied by well-known plating processes. Following the application of the barrier layer 265, the mask 290 may be stripped by ashing, solvent stripping or the like. With the barrier layer 265 in place, the stack of the chips 15 and 20 may be mounted to the circuit board 25 depicted in FIG. 13 and the lid 30 and the solder thermal interface material 90 may be fitted as described elsewhere herein. The combination of the barrier layer 265 and if present, the seed layer 280, provide a barrier to the diffusion of the solder thermal interface material 90 into the portion of the semiconductor chip 20 proximate the active device region 40 thereof as shown in FIG. 13.

Figure 15:
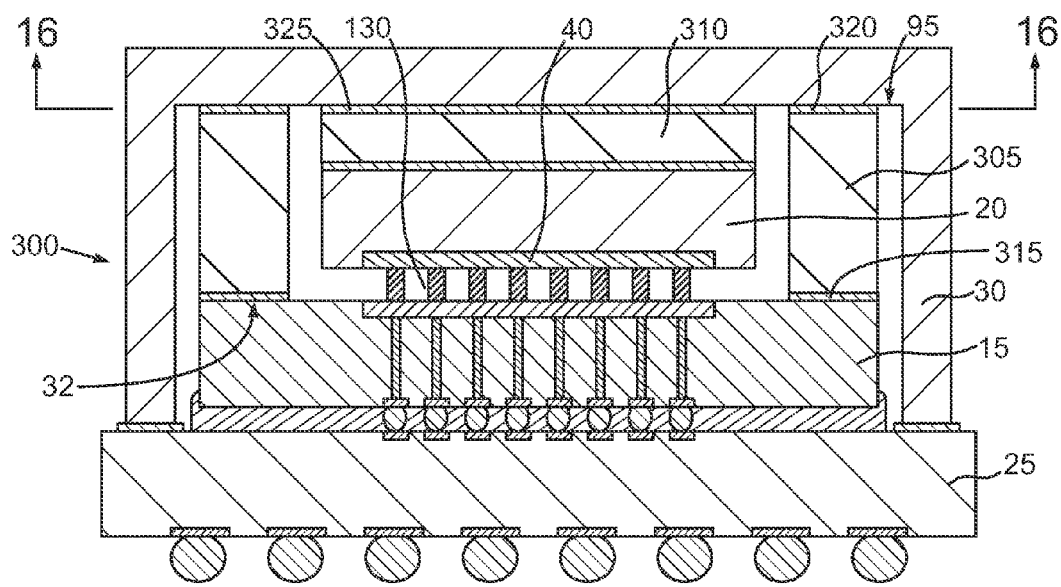
FIG. 15 is a sectional view of another alternate exemplary embodiment of a semiconductor chip device that includes stacked semiconductor chips.

Another alternative exemplary embodiment of a semiconductor chip device 300 may be understood by referring now to FIG. 15, which is a sectional view. The semiconductor chip device 300 may include the aforementioned semiconductor chips 15 and 20 in a stacked arrangement mounted on a circuit board 25 and covered by a lid 30 as described elsewhere herein with some notable exceptions. In this illustrative embodiment, the thermal pathways between the semiconductor chips 15 and 20 and the lid 30 are provided by two thermal interface material portions 305 and 310. The thermal interface material portion 305 provides a thermal pathway between the semiconductor chip 15 and the lid 30, and the thermal interface material portion 310 provides a thermal pathway between the semiconductor chip 20 and the lid 30. A gap 315 is deliberately provided between the portions 305 and 310 to avoid the potential for the diffusion of any thermal interface material into the portion of the chip 20 proximate the active device region 40 thereof. The thermal interface material portion 305 is correspondingly thicker than the thermal interface material portion 310 and wetted to a peripheral adhesion layer 320 formed on the principal surface 32 of the chip 15 and a peripheral adhesion layer 320 formed on the under surface 95 of the lid 30. The thermal interface material portion 310 is wetted to the adhesion layer 120 of the chip 20 and a central adhesion layer 325 on the under surface 95 of the lid 30. The thermal interface material portions 305 and 310 may be fitted as preforms to the lid 30 prior to seating the lid 30 on the circuit board 25 or as preforms fitted first to the chips 15 and 20, respectively. Some care will have to be exercised in order to ensure that the thermal interface material portion 305 does not invade the space 130 between the chips 15 and 20 during a reflow process to metallurgically bond the thermal interface material portions 305 and 310 to the various adhesion layers 320 and 325.

Figure 16:
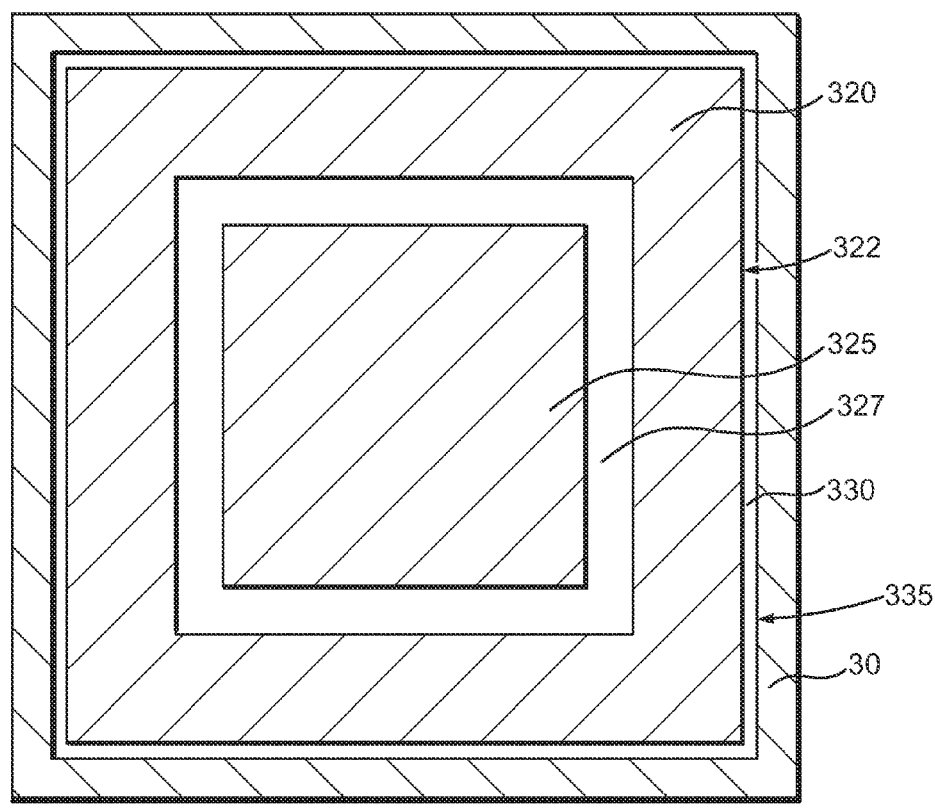
FIG. 16 is a sectional view of FIG. 15 taken at section 16-16.

Additional details of the peripheral adhesion layer 320 and the central adhesion layer portions 325 may be understood by referring now to FIG. 16, which is a sectional view of FIG. 15 taken at section 16-16. The peripheral portion 320 and the central portion 325 are separated by the gap 327. Like the other adhesion layers disclosed herein, the adhesion layers 320 and 325 may be composed of a material(s) that wet whatever films are positioned above and below. In an exemplary embodiment, the adhesion layers 320 and 325 may be composed of gold. A gap 330 between the peripheral portion 320 and the lid sidewall 335 is optional.

Figure 17:
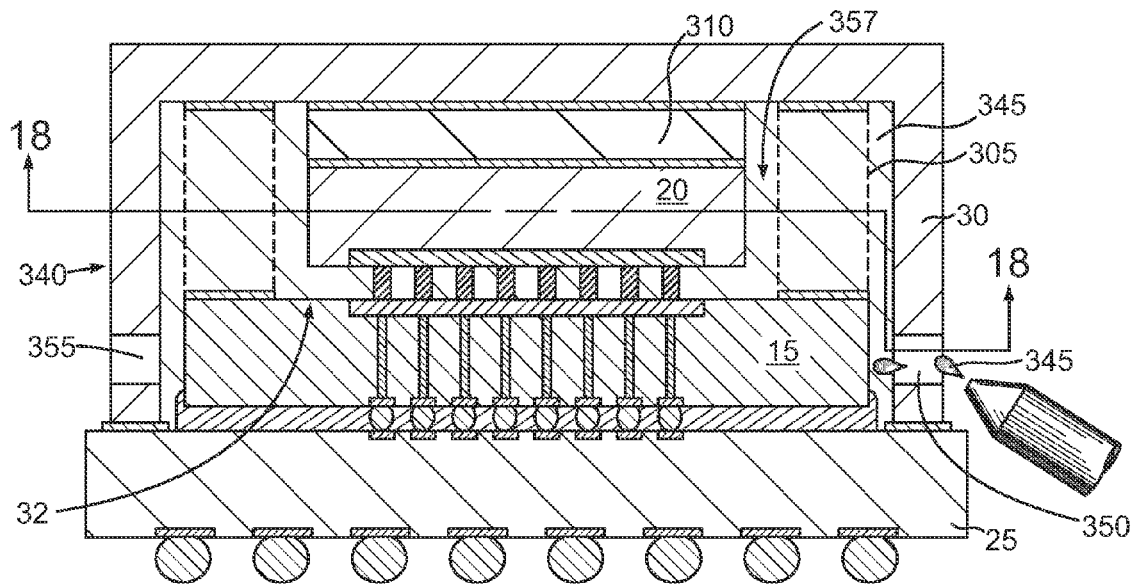
FIG. 17 is a sectional view of another alternate exemplary embodiment of a semiconductor chip device that includes stacked semiconductor chips.

Another alternate exemplary embodiment of a semiconductor chip device 340 may be understood by referring now to FIG. 17, which is a sectional view. This illustrative embodiment of the semiconductor chip device 340 may share the same attributes as the illustrative embodiment of the semiconductor chip device 300 depicted in FIGS. 15 and 16 and described elsewhere herein. In this regard, the device 340 may include the semiconductor chips 15 and 20 in a stacked arrangement mounted on a circuit board 25, enclosed by the lid 30 and provided with thermal pathways by the thermal interface material portions 305 and 310. However, in this illustrative embodiment, the lid 30 and the thermal interface material portion 305 may be modified to enable a polymeric thermal interface material 345 to be injected into various cavities inside the lid 30. Because FIG. 17 depicts the semiconductor chip device 340 after the injection of the polymeric thermal interface material 345, the thermal interface material portion 305 is obscured and thus shown in phantom. To facilitate the injection of polymeric thermal interface material 345, the lid 330 may be provided with an inlet opening 350 and an outlet opening 355. The outlet opening 355 is designed to allow air to escape during the injection process. To enable the polymeric material 345 to surround the semiconductor chip 20 and thus make contact with a portion of the principal side 32 of the semiconductor chip 15, the thermal interface material portion 305 must have some sort of opening to facilitate the movement of the polymeric thermal interface material 345 into the gap 357 between the semiconductor chip 20 and the thermal interface material portion 305.

Figure 18:
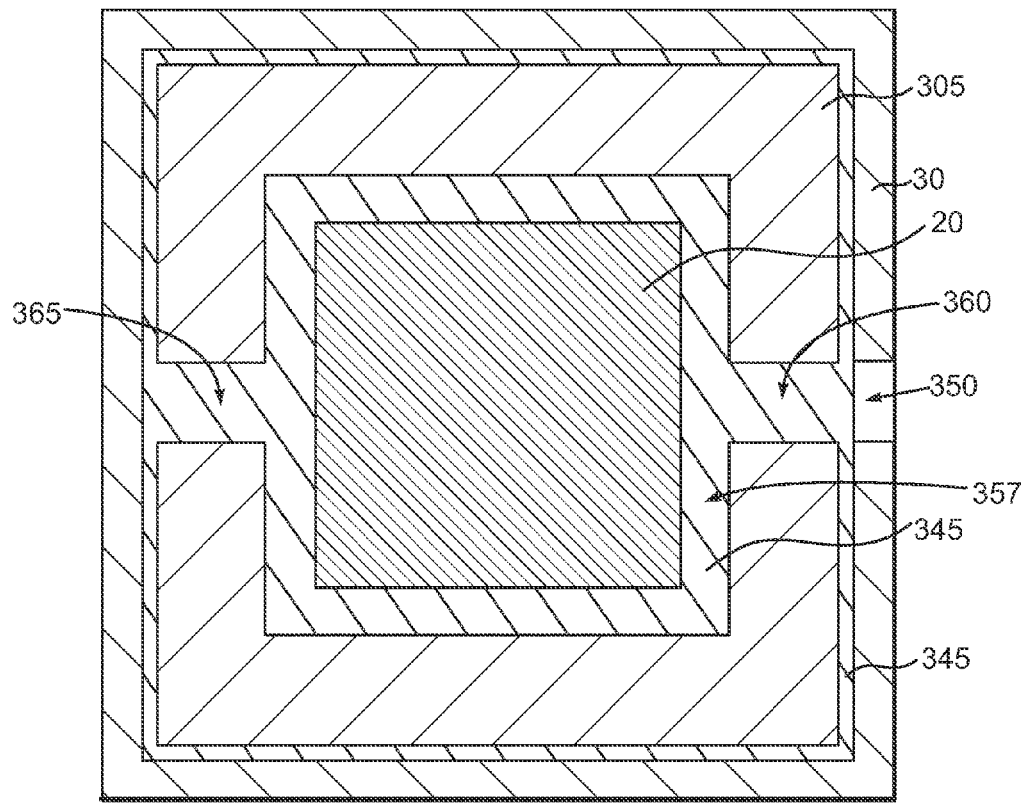
FIG. 18 is a sectional view of FIG. 17 taken at section 18-18.

Additional details of the thermal interface material portion 305 may be understood by referring now to FIG. 18, which is a sectional view of FIG. 17 taken at section 18-18. Note that section 18-18 passes through the inlet opening 350, the thermal interface material portion 305, the semiconductor chip 20, the injected thermal interface material 345, the lid 30 and the gap 357. Note that the thermal interface material portion 305 is formed with openings 360 and 365 to facilitate the injection of the thermal interface material 345 not only into the space between the thermal interface material portion 305 and the lid walls but also into the gap 357 between the semiconductor chip 20 and the thermal interface material portion 305. The thermal interface material 345 may be composed of a variety of polymeric materials suitable for thermal interface materials such as, for example, silicone rubber mixed with zinc oxide. Optionally, compliant base materials other than silicone rubber and thermally but not electrically conductive particles may be used.

Figure 19:
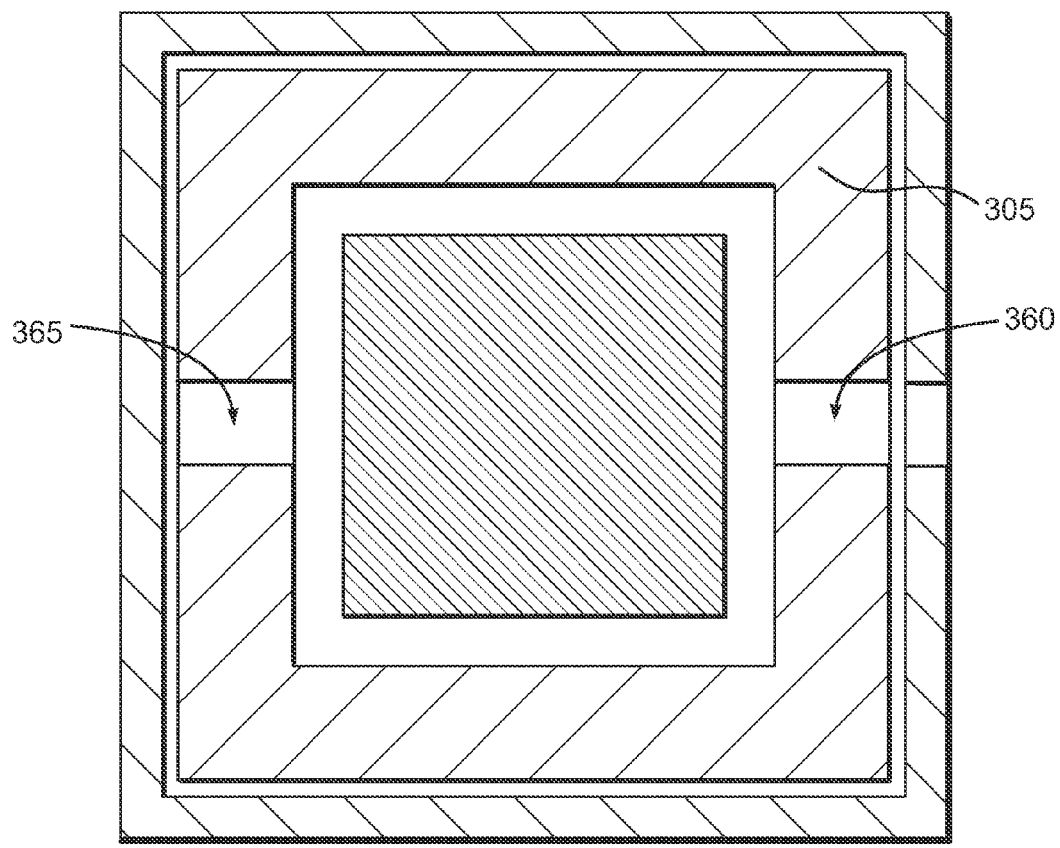
FIG. 19 is a sectional view like FIG. 18, but depicting a stage of processing prior to application of a polymer thermal interface material.

It may be useful to briefly observe the same sectional view as FIG. 18 but without the injection of the polymeric thermal interface material 345. In this regard, attention is now turned to FIG. 19 which shows the openings 360 and 365 in the thermal interface material portion 305. It should be understood that the adhesion layers 320, 325 and 315 should be formed with the same footprint as the thermal interface material portion and thus be discontinuous so that the openings 360 and 365 will be established.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   stacking a first semiconductor chip including first and second principal sides and a first peripheral wall on a second semiconductor chip including first and second principal sides and a second peripheral wall with a gap between the first and second semiconductor chips;
   forming a barrier layer covering at least the first peripheral wall of the first semiconductor chip, the second principal side of the first semiconductor chip, a portion of the first principal side of the second semiconductor chip and the second peripheral wall; and
   positioning a solder-type thermal interface material around the first peripheral wall, the barrier layer inhibiting diffusion of the solder-type thermal interface material into the first peripheral wall.

2. The method of claim 1, wherein the first semiconductor chip comprises a first active circuitry portion, the method comprising positioning a dike between the first and second semiconductor chips and surrounding the first active circuitry portion to prevent the solder-type thermal interface material from entering the gap.

3. The method of claim 1, wherein the barrier layer comprises gold.

4. The method of claim 3, comprising applying a copper seed layer to at least the first peripheral wall prior to applying the barrier layer.

5. The method of claim 1, comprising mounting the first and second semiconductor chips to a circuit board.

6. An apparatus, comprising:
   a first semiconductor chip including first and second principal sides, a first peripheral wall and a first active circuitry portion on the first principal side;
   a second semiconductor chip including a first principal side, a second principal side and a second peripheral wall, the first principal side of the second semiconductor chip coupled in opposition to the first principal side of the first semiconductor chip with a gap between the first principal sides of the first and second semiconductor chips;
   a barrier layer covering at least the first peripheral wall of the first semiconductor chip;
   a dike positioned between the first and second semiconductor chips and surrounding the first active circuitry portion; and
   a solder-type thermal interface material surrounding the first peripheral wall, the barrier layer inhibiting diffusion of the solder-type thermal interface material into the first peripheral wall and the dike preventing the solder-type thermal interface material from entering the gap.

7. The apparatus of claim 6, wherein the barrier layer covers the second principal side of the first semiconductor chip, a portion of the first principal side of the second semiconductor chip and the second peripheral wall.

8. The apparatus of claim 6, wherein the barrier layer comprises gold.

9. The apparatus of claim 8, comprising a copper seed covering at least the first peripheral wall and positioned beneath the barrier layer.

10. The apparatus of claim 6, comprising a circuit board, the first and second semiconductor chips being mounted on the circuit board.

11. A method of manufacturing, comprising:
    stacking a first semiconductor chip including a first peripheral wall on a second semiconductor chip including a second peripheral wall with a gap between the first and second semiconductor chips, the first semiconductor chip including a first active circuitry portion;
    positioning a dike between the first and second semiconductor chips and surrounding the first active circuitry portion;

forming a barrier layer covering at least the first peripheral wall of the first semiconductor chip; and positioning a solder-type thermal interface material around the first peripheral wall, the barrier layer inhibiting diffusion of the solder-type thermal interface material into the first peripheral wall and the dike preventing the solder-type thermal interface material from entering the gap.

12. The method of claim 11, wherein the barrier layer comprises gold.

13. The method of claim 12, comprising applying a copper seed layer to at least the first peripheral wall prior to applying the barrier layer.

14. The method of claim 11, comprising mounting the first and second semiconductor chips to a circuit board.

* * * * *